US008964403B2

(12) United States Patent
Ueno

(10) Patent No.: US 8,964,403 B2
(45) Date of Patent: Feb. 24, 2015

(54) WIRING BOARD HAVING A REINFORCING MEMBER WITH CAPACITORS INCORPORATED THEREIN

(75) Inventor: Seigo Ueno, Iwakura (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 164 days.

(21) Appl. No.: 13/294,763

(22) Filed: Nov. 11, 2011

(65) Prior Publication Data

US 2012/0120614 A1    May 17, 2012

(30) Foreign Application Priority Data

Nov. 17, 2010 (JP) .................................. 2010-256784
Nov. 17, 2010 (JP) .................................. 2010-256785

(51) Int. Cl.
H05K 1/18 (2006.01)
H01L 23/498 (2006.01)
H05K 1/02 (2006.01)
H05K 1/16 (2006.01)
H05K 3/46 (2006.01)

(52) U.S. Cl.
CPC .......... *H05K 1/183* (2013.01); *H01L 23/49833* (2013.01); *H05K 1/0231* (2013.01); *H05K 1/162* (2013.01); *H05K 1/181* (2013.01); *H05K 3/4614* (2013.01); *H05K 2201/10318* (2013.01); *H05K 2201/10674* (2013.01); *H05K 2201/2018* (2013.01); *H01L 2224/16225* (2013.01)
USPC ............ 361/761; 361/760; 361/748; 174/260

(58) Field of Classification Search
USPC ............................ 361/761, 760, 748; 174/260
See application file for complete search history.

(56) References Cited

U.S. PATENT DOCUMENTS

| 8,339,797 | B2 | 12/2012 | Maeda et al. | |
|---|---|---|---|---|
| 2008/0223607 | A1* | 9/2008 | Muramatsu et al. | 174/260 |
| 2009/0095518 | A1* | 4/2009 | Matsushita et al. | 174/261 |
| 2010/0181285 | A1* | 7/2010 | Tanaka | 216/17 |
| 2010/0232126 | A1 | 9/2010 | Maeda et al. | |
| 2013/0083502 | A1 | 4/2013 | Maeda et al. | |

FOREIGN PATENT DOCUMENTS

| JP | H05-021701 A | 1/1993 |
|---|---|---|
| JP | H07-212042 A | 8/1995 |

(Continued)

OTHER PUBLICATIONS

Japanese Patent Office, Office Action issued in corresponding Japanese application 2010-256785, issued on Feb. 19, 2014.

(Continued)

*Primary Examiner* — Andargie M Aychillhum
(74) *Attorney, Agent, or Firm* — Stites & Harbison PLLC; Jeffrey A. Haeberlin; James R. Hayne

(57) ABSTRACT

There is provided a wiring board including a multilayer substrate and a reinforcing member. The multilayer substrate has a first main substrate surface formed with a chip mounting area to which an electronic chip is mounted and a second main substrate surface opposed to the first main substrate surface. The reinforcing member is fixed to either an area of the first main substrate surface other than the chip mounting area or the second main substrate surface and has a body predominantly formed of ceramic material and incorporating therein at least one capacitor.

1 Claim, 12 Drawing Sheets

(56) References Cited

FOREIGN PATENT DOCUMENTS

| JP | 2001-223315 | A |   | 8/2001  |         |
|----|-------------|---|---|---------|---------|
| JP | 2003-229672 | A |   | 8/2003  |         |
| JP | 2004146766  | A | * | 5/2004  | H05K 3/46 |
| JP | 2005-302924 | A |   | 10/2005 |         |
| JP | 2005302924  | A | * | 10/2005 | H05K 3/46 |
| JP | 2007-027255 | A |   | 2/2007  |         |
| JP | 2010-040669 | A |   | 2/2010  |         |
| JP | 2010-212595 | A |   | 9/2010  |         |

OTHER PUBLICATIONS

JPO, Office Action issued in corresponding Japanese application No. 2010-256784, dispatched Nov. 26, 2013.

* cited by examiner

WIRING BOARD HAVING A REINFORCING MEMBER WITH CAPACITORS INCORPORATED THEREIN

BACKGROUND OF THE INVENTION

The present invention relates to a wiring board.

There is known a wiring board for mounting thereon a semiconductor chip in CPU etc. as disclosed in Japanese Laid-Open Patent Publication No. 2005-302924 and No. 2010-40669. In general, the wiring board has a substrate and a plurality of chip capacitors arranged as decoupling capacitors on a surface of the substrate. It is thus necessary to, in the case where the wiring board is reinforced with a reinforcing member such as a stiffener, fix the reinforcing member to any part of the substrate other than the part on which the chip capacitors are arranged. This results in a difficulty of saving space in the wiring board and simplifying the manufacturing process of the wiring board. On the other hands, there is a growing demand to impart high performance to the wiring board for improvement of scalability. The above difficulty and demand are common to all wiring boards including not only those for mounting thereon semiconductor chips but also those for mounting thereon other kinds of electronic chips.

SUMMARY OF THE INVENTION

The present invention has been made to solve at least part of the above-mentioned prior art problems. It is an object of the present invention to provide a wiring board in which the number of chip capacitors on a substrate can be reduced or eliminated for simplification of manufacturing process and for improvement of scalability.

According to an aspect of the present invention, there is provided a wiring board, comprising: a multilayer substrate having a first main substrate surface and a second main substrate surface opposed to the first main substrate surface, the first main substrate surface including a chip mounting area to which an electronic chip is mounted; and a reinforcing member fixed to either an area of the first main substrate surface other than the chip mounting area or the second main substrate surface, the reinforcing member having a body predominantly formed of ceramic material and incorporating therein at least one capacitor.

In one preferred embodiment, the reinforcing member is fixed to the area of the first main substrate surface other than the chip mounting area and has an opening formed therethrough in such a manner that the chip mounting area is exposed through the opening.

In another preferred embodiment, the reinforcing member is fixed to the second main substrate surface and has a circuit pattern formed on a surface thereof.

The other objects and features of the present invention will also become understood from the following description.

DESCRIPTION OF THE EMBODIMENTS

Figure 1A:
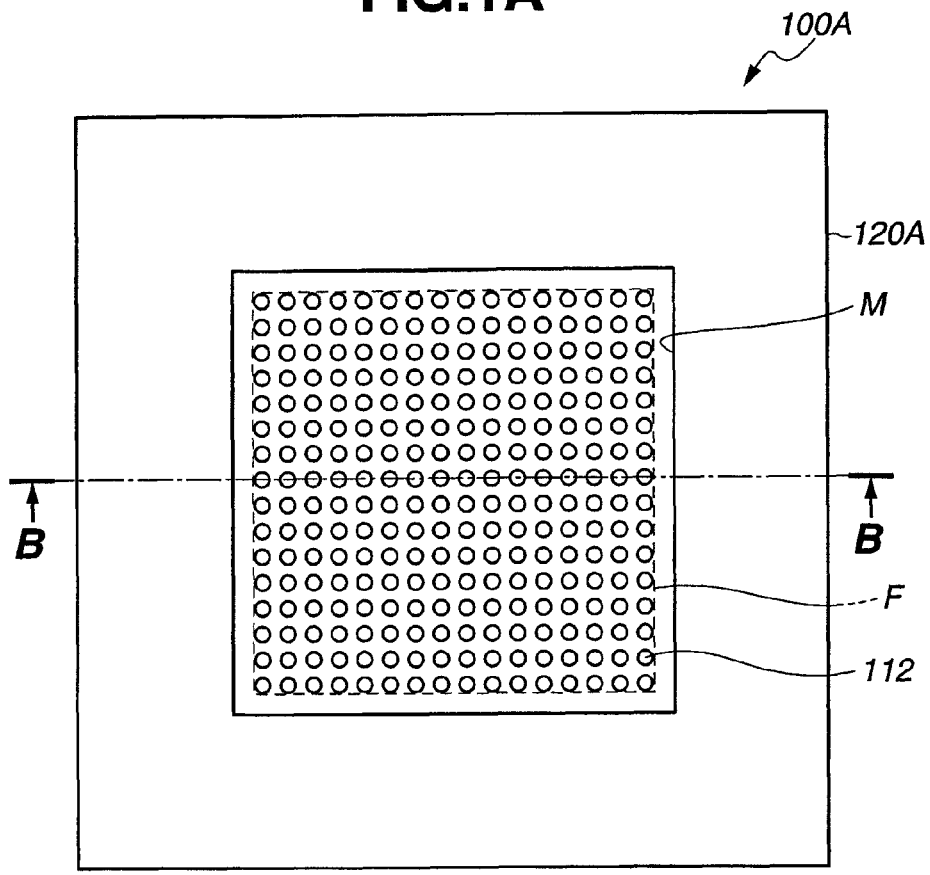
FIG. 1A is a plan view of a wiring board according to a first embodiment of the present invention.

The present invention will be described in detail below by way of the following first to seventh exemplary embodiments.

First Embodiment

A wiring board 100A according to the first embodiment is designed to mount thereon a semiconductor chip 102 (as an electronic chip) and thereby function as a connector for connection of the semiconductor chip 102 to a printed circuit board of a computer etc. as shown in FIGS. 1A, 1B, 2A and 2B. The wiring board 100A includes a multilayer substrate 110 and a stiffener 120A (as a reinforcing member).

The multilayer substrate 110 is formed into a substantially square shape with first and second opposed main substrate surfaces SA1 and SA2. A chip mounting area F to which the semiconductor chip 102 is mounted is defined on the first main substrate surface SA1. Although not specifically shown in the drawings, the multilayer substrate 110 has a laminated multilayer structure in which wiring layers and insulating resin layers are alternately laminated together. (Hatching is not given to the multilayer substrate 110 in FIGS. 1B and 2B for the sake of the viewability of the drawings.) The wiring layers can be formed of e.g. copper plating; and the insulating resin layers can be formed of e.g. epoxy resin.

A plurality of first terminals 112 are arranged on the chip mounting area F for electrical connection to terminals of the semiconductor chip 102, whereas a plurality of second terminals 114 are arranged on the second main substrate surface SA2 for electrical connection to terminals of the printed circuit board. The first terminals 112 and the second terminals 114 are electrically connected to each other via the wiring layers of the multilayer substrate 110. In the first embodiment, terminals for flip-chip bonding are adopted as the first terminals 112; and PGA (Pin Grid Array) terminals are adopted as the second terminals 114.

The stiffener 120A is formed into a substantially square shape and fixed to an area of the first main substrate surface SA1 other than the chip mounting area F for reinforcement of the multilayer substrate 110. (The area to which the stiffener 120A is fixed does not overlap the chip mounting area F when viewed in plane.) In the first embodiment, the stiffener 120A is fixed to a circumferential area of the first main substrate surface SA1. An opening M is formed in the center of the stiffener 120A so that the chip mounting area F is exposed through the opening M.

Figure 1B:
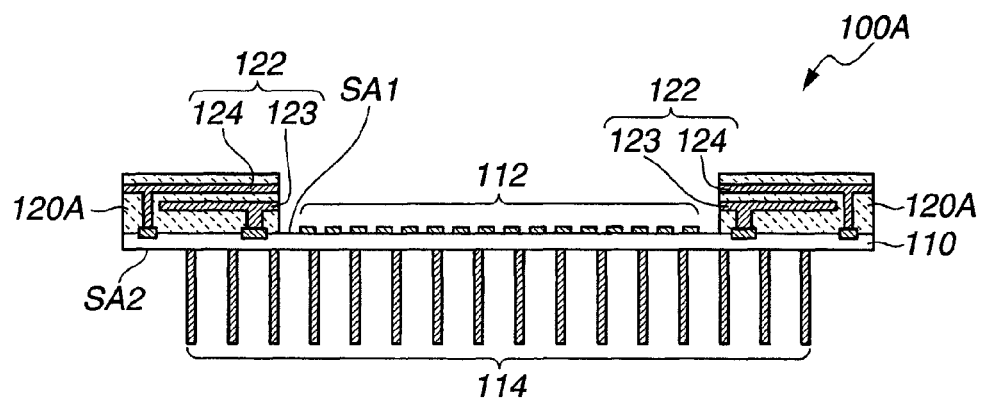
FIG. 1B is a cross-section view of FIG. 1A taken along line B-B.
Figure 2A:
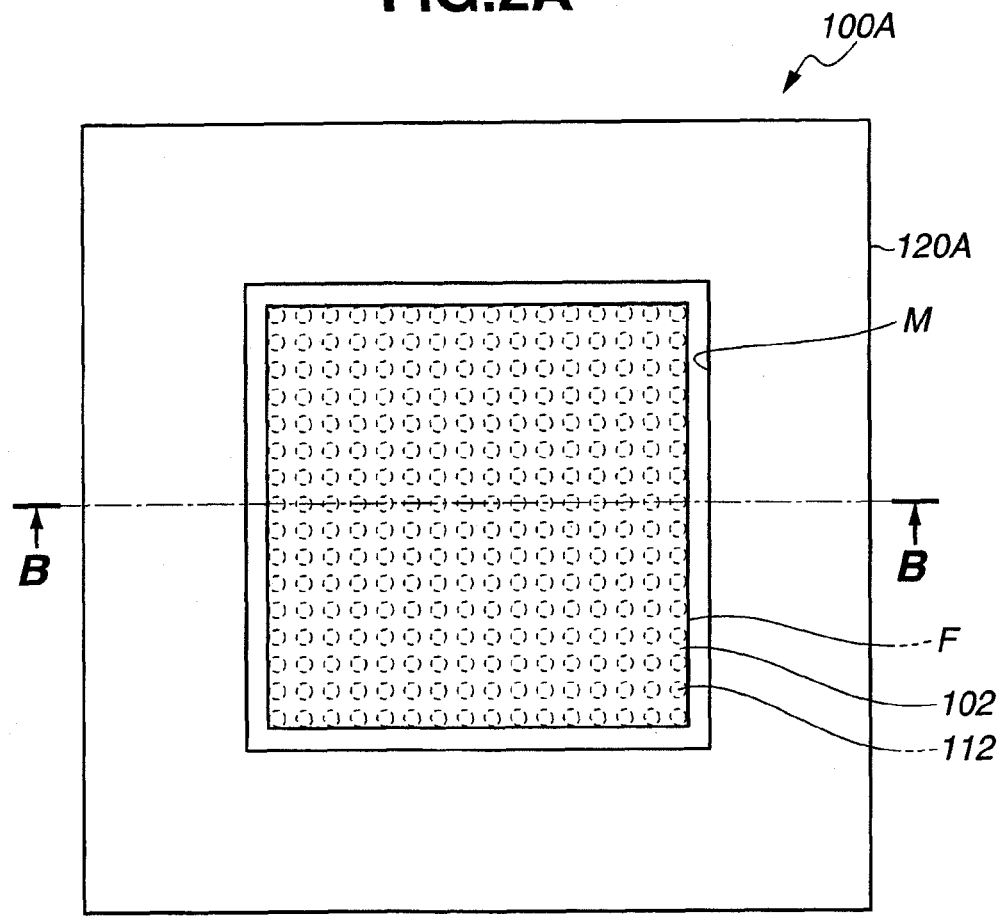
FIG. 2A is a plan view of the wiring board of FIGS. 1A and 1B in a state of mounting thereon a semiconductor chip.
Figure 2B:
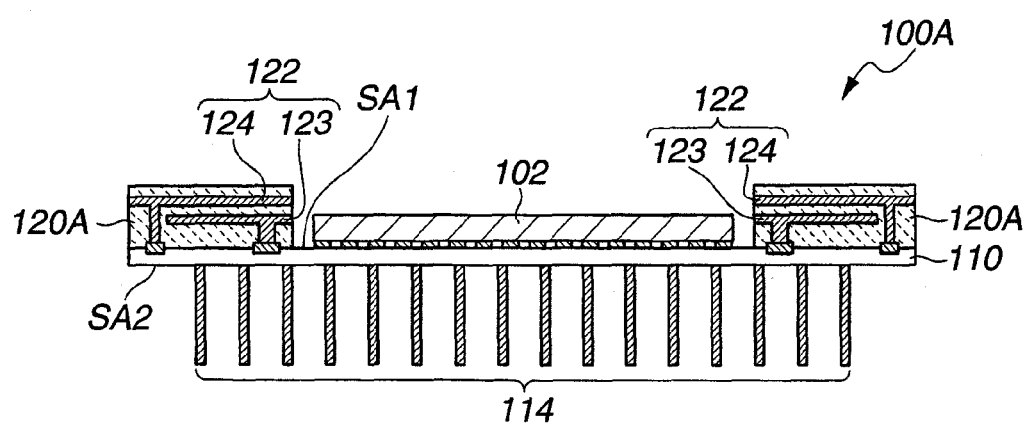
FIG. 2B is a cross-section view of FIG. 2A taken along line B-B.

As shown in FIGS. 1B and 2B, the stiffener 120A has its body predominantly formed of ceramic material and incorporating therein a plurality of capacitors 122. Each of the capacitors 122 is designed as a laminated capacitor in which first and second electrode layers 123 and 124 and ceramic layers are alternately laminated together for ease of incorporation of the capacitors 122 in the stiffener 120A. The stiffener 120A also has cylindrical conductors formed in a thickness direction thereof. The first and second electrode layers 123 and 124 are electrically connected to the multilayer substrate 110 via these cylindrical conductors so that the capacitors 122 function as so-called decoupling capacitors. In the case where the stiffener 120A has a plurality of laminated capacitors 122 as mentioned above, the first electrode layers 123 of the respective capacitors 122 are formed as a plurality of electrically independent electrode patterns in the same layer (plane); and the second electrode layers 124 of the respective capacitors 122 are formed as a plurality of electrically independent electrode patterns in the same layer (plane).

For example, the stiffener 120A with the capacitors 122 can be produced by the following procedure. A paste containing a conductor material e.g. nickel, silver or palladium and dielectric sheets (called "green sheets") containing barium titanate etc. are first prepared. The conductor paste is applied to surfaces of the dielectric sheets by screen printing, thereby forming electrode layers on surfaces of the dielectric sheets. The dielectric sheets with the electrode layers are laminated together and then subjected to firing. Herein, the cylindrical conductors can be formed by making through holes in the dielectric sheets with the electrode layers by any known technique e.g. laser irradiation or punching, and then, pressing a paste containing nickel etc. as a conductor material into the through holes.

Figure 3:
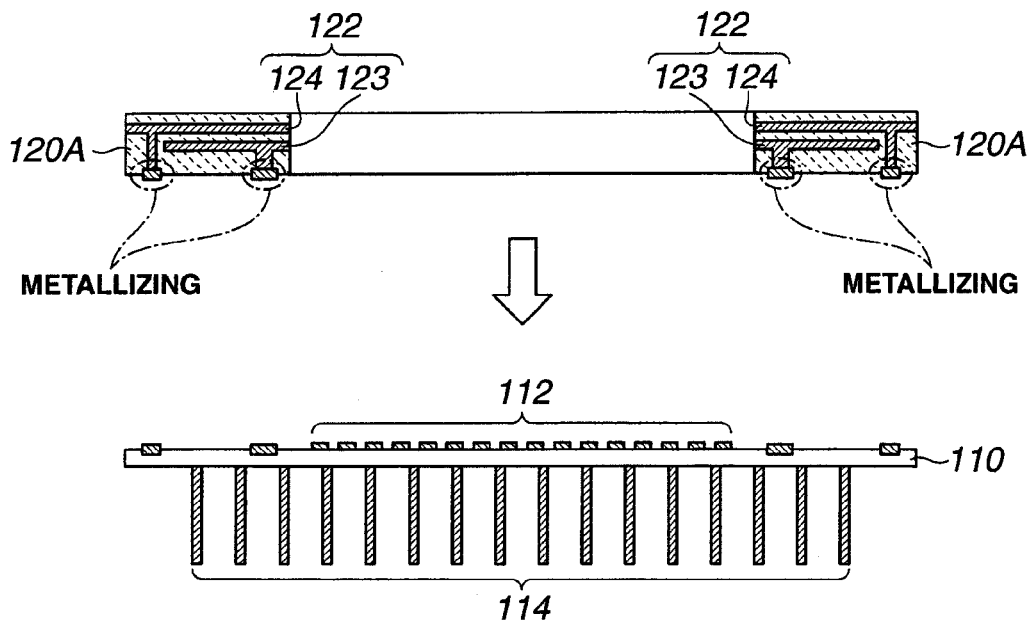
FIG. 3 is a schematic view showing one process for fixing a reinforcing member to a multilayer substrate in the wiring board according to the first embodiment of the present invention.
Figure 4:
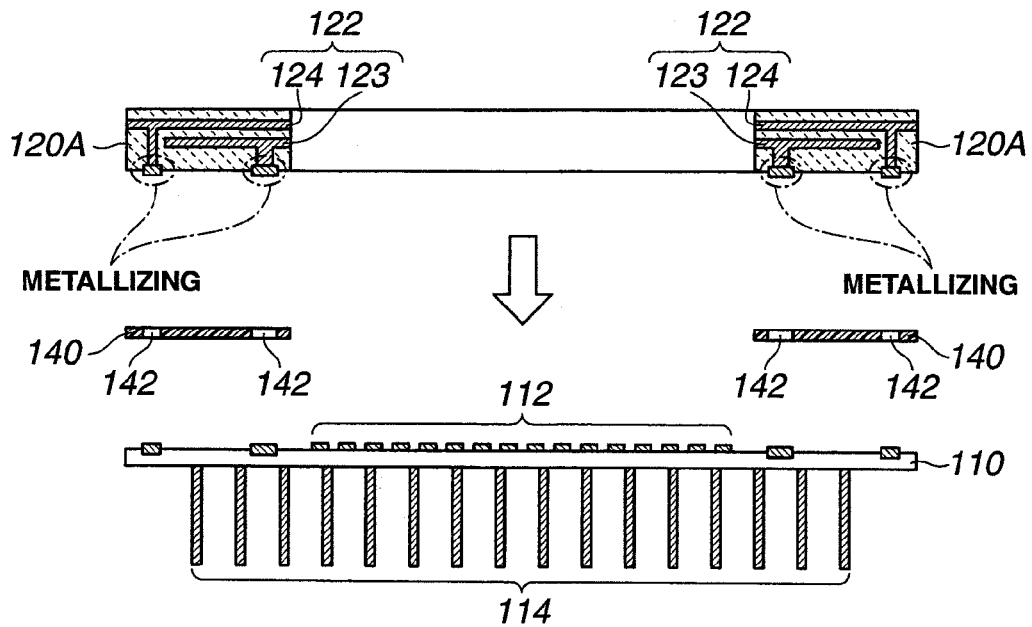
FIG. 4 is a schematic view showing another process for fixing a reinforcing member to a multilayer substrate in the wiring board according to the first embodiment of the present invention.

Further, the stiffener 120A with the capacitors 122 can be fixed to the multilayer substrate 110 by either of the following fixing processes of FIGS. 3 and 4.

In the fixing process of FIG. 3, copper is metallized on electrodes (terminals) of the capacitors 122 exposed at the surface of the stiffener 120A by any known thin-film forming technique e.g. PVD. After that, solder printing is applied to component connection terminals on the circumferential area of the first main substrate surface SA1 of the multilayer substrate 110. The stiffener 120A is placed on the multilayer substrate 110 to align the copper-metallized electrodes of the capacitors 122 with the solder-printed terminals of the multilayer substrate 110. The stiffener 120A is then joined to the multilayer substrate 110 by heat treatment.

In the fixing process of FIG. 4, copper is metallized on electrodes (terminals) of the capacitors 122 exposed at the surface of the stiffener 120A by any known thin-film forming technique. After that, solder printing is applied to component connection terminals on the circumferential area of the first main substrate surface SA1 of the multilayer substrate 110. The stiffener 120A is pressed onto the multilayer substrate 110, with resin material 140 interposed therebetween, to align the copper-metallized electrodes of the capacitors 122 with the solder-printed terminals of the multilayer substrate 110. The stiffener 120A is then joined to the multilayer substrate 110 by heat treatment. Alternatively, the stiffener 120A may be joined by heat treatment to the multilayer substrate 110 after filling a conductive paste into holes 142 of the resin material 140.

As mentioned above, the capacitors 122 are incorporated in the stiffener 120 in the first embodiment. The adoption of such a stiffener 120 leads to a reduction or elimination of the number of chip capacitors separately arranged on the wiring board 100 (multilayer substrate 110) as well as increase of the strength of the wiring board 110. It is therefore possible to reduce or eliminate the space for chip capacitors in the wiring board 100 and simplify the manufacturing process of the wiring board 100 as compared to the case where a reinforcing member and chip capacitors are separately arranged. It is also possible to secure high capacitance of the capacitors 122 as a plurality of capacitors 122, each having a plurality of electrode layers precisely laminated to each other, can be formed in a wide range of the stiffener 120.

Second Embodiment

Figure 5A:
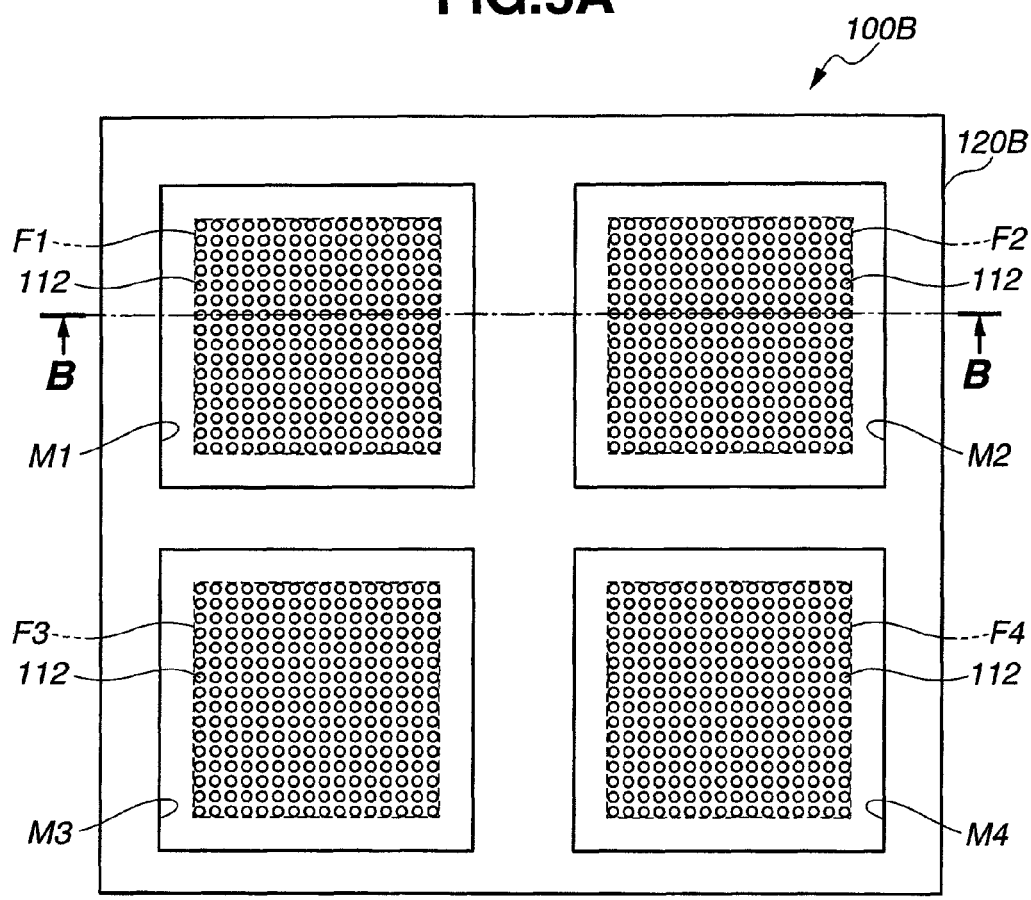
FIG. 5A is a plan view of a wiring board according to a second embodiment of the present invention.
Figure 5B:
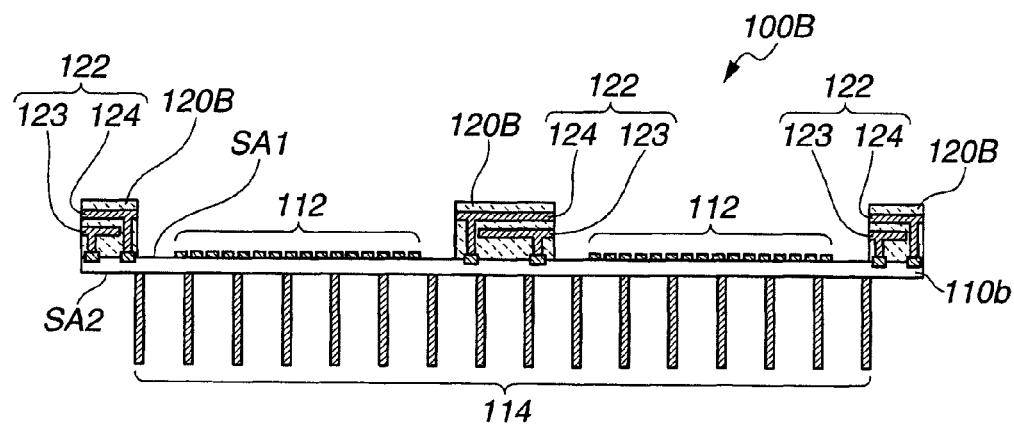
FIG. 5B is a cross-section view of FIG. 5A taken along line B-B.

A wiring board 100B according to the second embodiment is structurally similar to the wiring board 100A according to the first embodiment, except that the wiring board 100B is designed to mount thereon a plurality of semiconductor chips 102 as shown in FIGS. 5A and 5B. More specifically, the wiring board 100B includes a multilayer substrate 110B and a stiffener 120B (as a reinforcing member). The multilayer substrate 110B has a first main substrate surface SA1 formed with four chip mounting areas F1, F2, F3 and F4. The stiffener 120B has a circumferential part and an inner wall part extending inside the circumferential part to define four openings M1, M2, M3 and F4 corresponding to the chip mounting areas F1, F2, F3 and F4 so that the chip mounting areas F1, F2, F3 and F4 are exposed through the openings M1, M2, M3 and F4, respectively. As shown in FIG. 5B, the stiffener 120B incorporate a plurality of capacitors 122 in the circumferential and inner wall parts thereof.

It is therefore possible in the second embodiment not only to obtain the same effects as in the first embodiment but also to mount a plurality of semiconductor chips 102 on the wiring board 110B. It is also possible to increase the strength of the wiring board 110B as the stiffener 120B has its inner wall part extending between the chip mounting areas F1, F2, F3 and F4. As the capacitors 122 can be formed in such an inner wall part of the stiffener 120, it is possible to decrease the distance between the semiconductor chip 102 and the capacitors 122 and improve the electrical characteristics of the capacitors 122 as the decoupling capacitors.

Third Embodiment

Figure 6A:
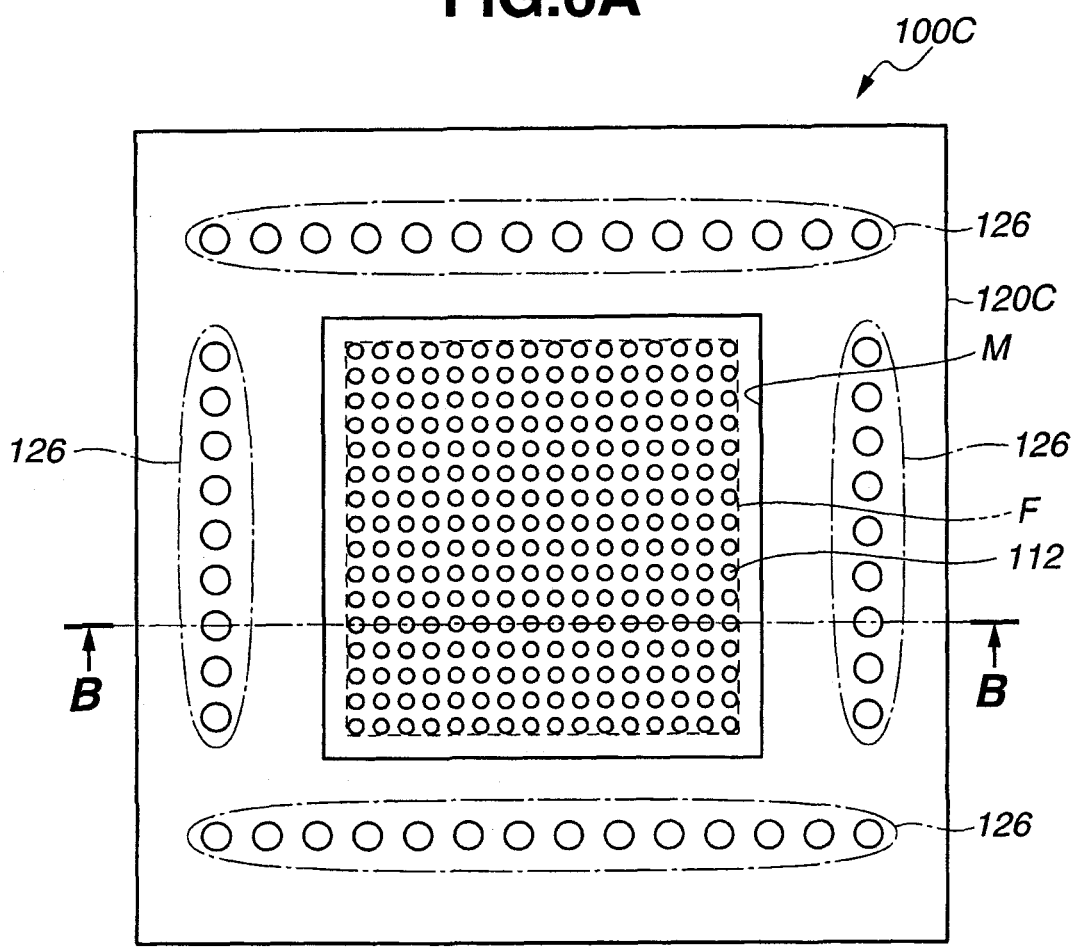
FIG. 6A is a plan view of a wiring board according to a third embodiment of the present invention.
Figure 6B:
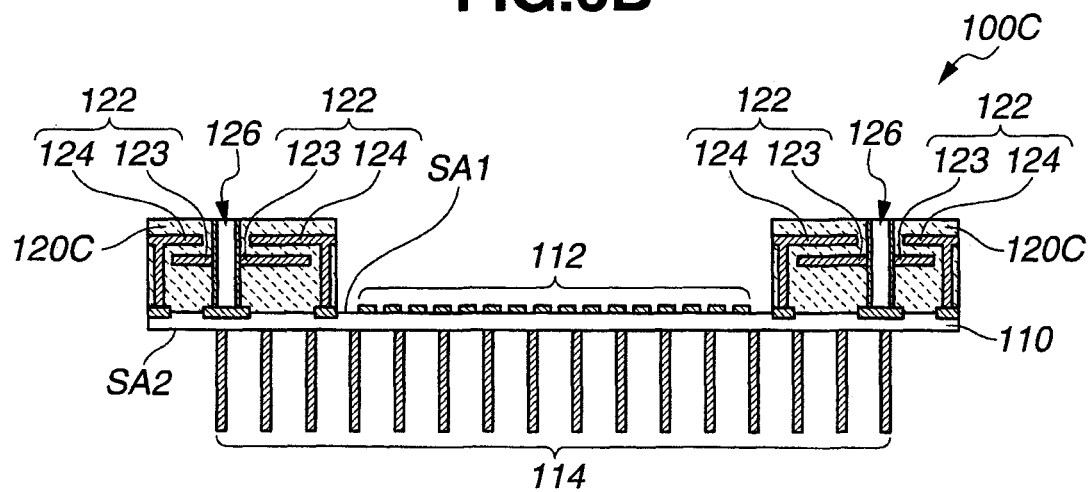
FIG. 6B is a cross-section view of FIG. 6A taken along line B-B.

A wiring board 100C according to the third embodiment is structurally similar to the wiring board 100A according to the first embodiment, except the wiring board 100C has a stiffener 120C (as a reinforcing member) in which a plurality of through holes 126 are formed in a thickness direction of the stiffener 120C as shown in FIGS. 6A and 6B. Each of the through holes 126 has an electrode formed on an inner surface thereof and electrically connected to part of the electrode layers 123 and 124 of the capacitor 122 so that the electrodes of the through holes 126 function as terminals of the capacitors 122 for connection to the multilayer substrate 110.

It is therefore possible in the third embodiment not only to obtain the same effects as in the first embodiment but also to allow easy electrical connection between the capacitors 122 and the multilayer substrate 110 by the through holes 126.

Fourth Embodiment

Figure 7A:
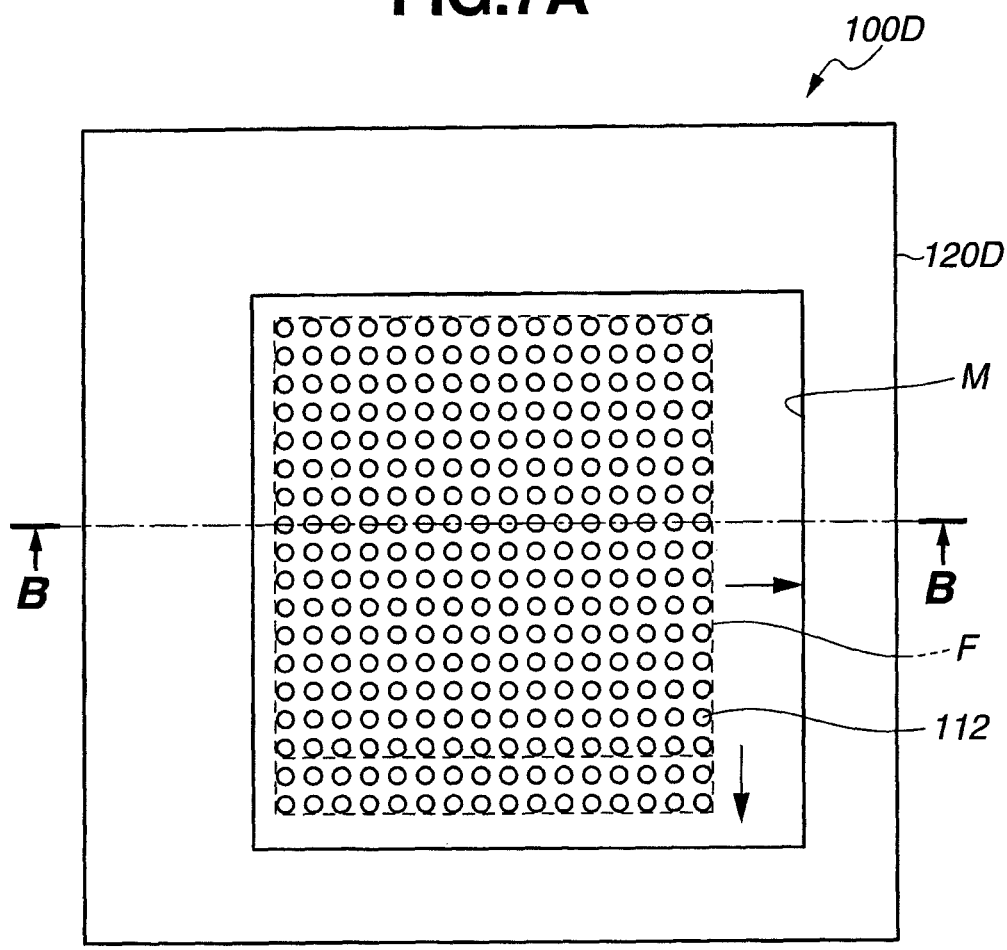
FIG. 7A is a plan view of a wiring board according to a fourth embodiment of the present invention.
Figure 7B:
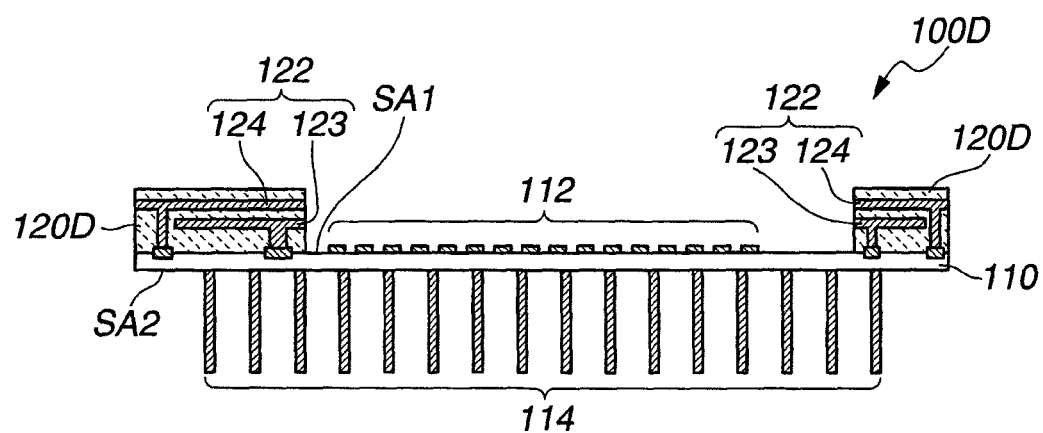
FIG. 7B is a cross-section view of FIG. 7A taken along line B-B.

A wiring board 100D according to the fourth embodiment is structurally similar to the wiring board 100A according to the first embodiment, except the wiring board 100D has a stiffener 120D (as a reinforcing member) formed in such a manner that the width of part of the stiffener 120D is made smaller, that is, the size of the opening M of the stiffener 120D is made larger as shown in FIGS. 7A and 7B.

It is therefore possible in the fourth embodiment not only to obtain the same effects as in the first embodiment but also to define a larger chip mounting area F for mounting a larger-size semiconductor chip 102 on the multilayer substrate 110 and leave space between the chip mounting area F and the stiffener 120D for ease of mounting the semiconductor chip 102 to the wiring board 100D.

Fifth Embodiment

Figure 8A:
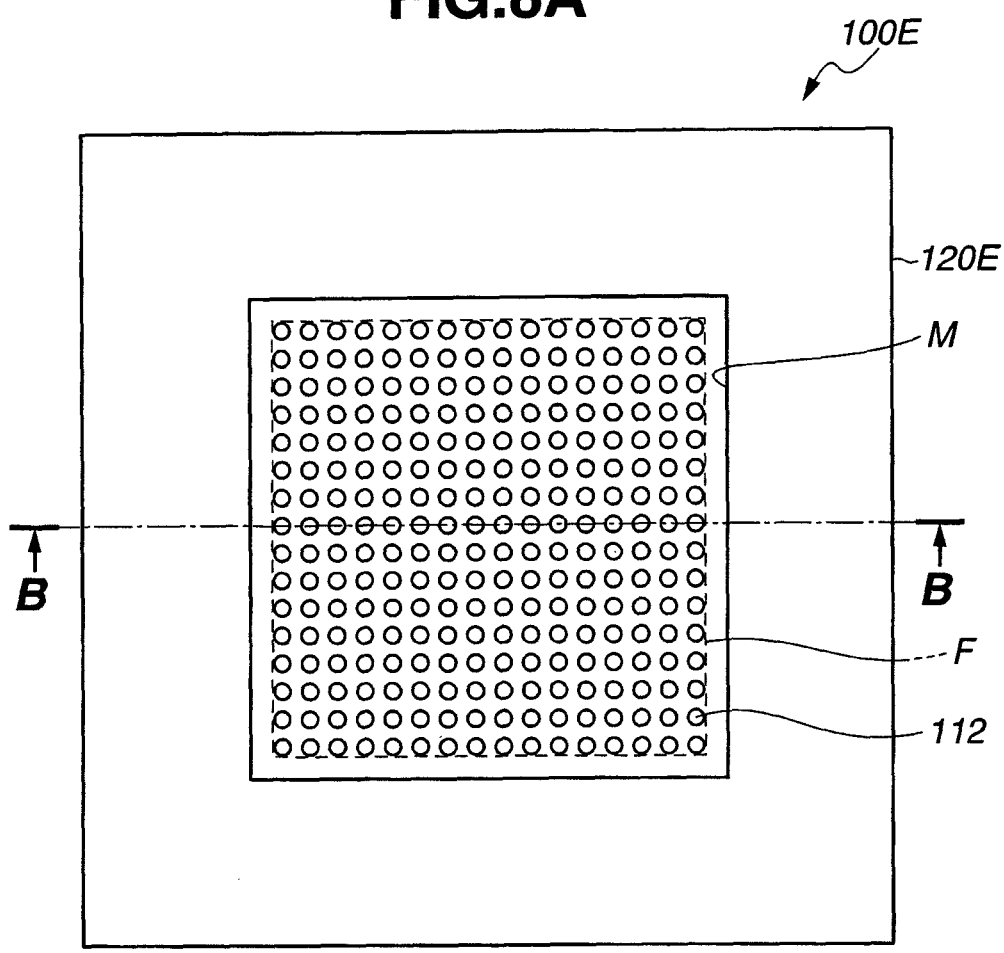
FIG. 8A is a plan view of a wiring board according to a fifth embodiment of the present invention.
Figure 8B:
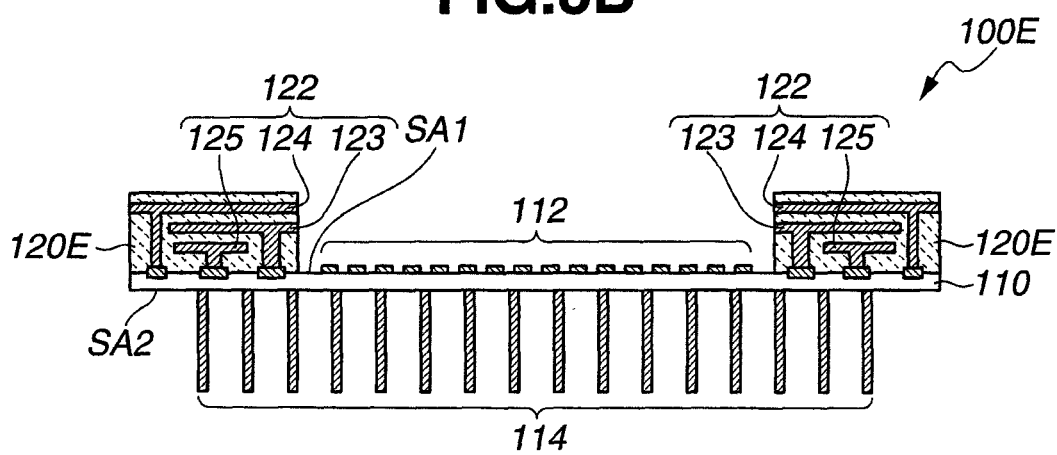
FIG. 8B is a cross-section view of FIG. 8A taken along line B-B.

A wiring board 100E according to the fifth embodiment is structurally similar to the wiring board 100A according to the first embodiment, except it has a stiffener 120E (as a reinforcing member) incorporating therein a plurality of capacitors 122, each of which has first to third electrode layers 123 to 125, as shown in FIGS. 8A and 8B.

It is therefore possible in the fifth embodiment not only to obtain the same effects as in the first embodiment but also to increase the capacitance of the capacitors 122 due to an increased number of electrode layers in the capacitor 122.

Sixth Embodiment

A wiring board 100F according to the sixth embodiment is provided with a multilayer substrate 110, a stiffener 220 and a reinforcing plate 130A (as a reinforcing member) as shown in FIGS. 9A, 9B, 10A and 10B.

In the sixth embodiment, the multilayer substrate 110 is structurally the same as that in the first embodiment. (Hatching is not also given to the multilayer substrate 110 in FIGS. 9B and 10B for the sake of the viewability of the drawings.) A chip mounting area F to which a semiconductor chip 102 is mounted is defined on the first main substrate surface SA1 of the multilayer substrate 110.

The stiffener 220 is substantially square-shaped and fixed by a thermosetting resin to an area of the first main substrate surface SA1 other than the chip mounting area F so as to reinforce the multilayer substrate 110 from the first main substrate surface side. In the sixth embodiment, the stiffener 220 is fixed to a circumferential area of the first main substrate surface SA1 around the chip mounting area F. The stiffener 220 can be herein formed of e.g. 42 alloy (Fe—Ni alloy containing 42% nickel). An opening M is formed in the center of the stiffener 220 so that the chip mounting area F is exposed through the opening M.

The reinforcing plate 130A is substantially square-shaped and fixed to the second main substrate surface SA2 of the multilayer substrate 110 so as to reinforce the multilayer substrate 110 from the second main substrate surface side and prevent warpage of the wiring board 100F, which is likely to occur at the time of mounting the semiconductor chip 102 on the chip mounting area F.

Figure 9A:
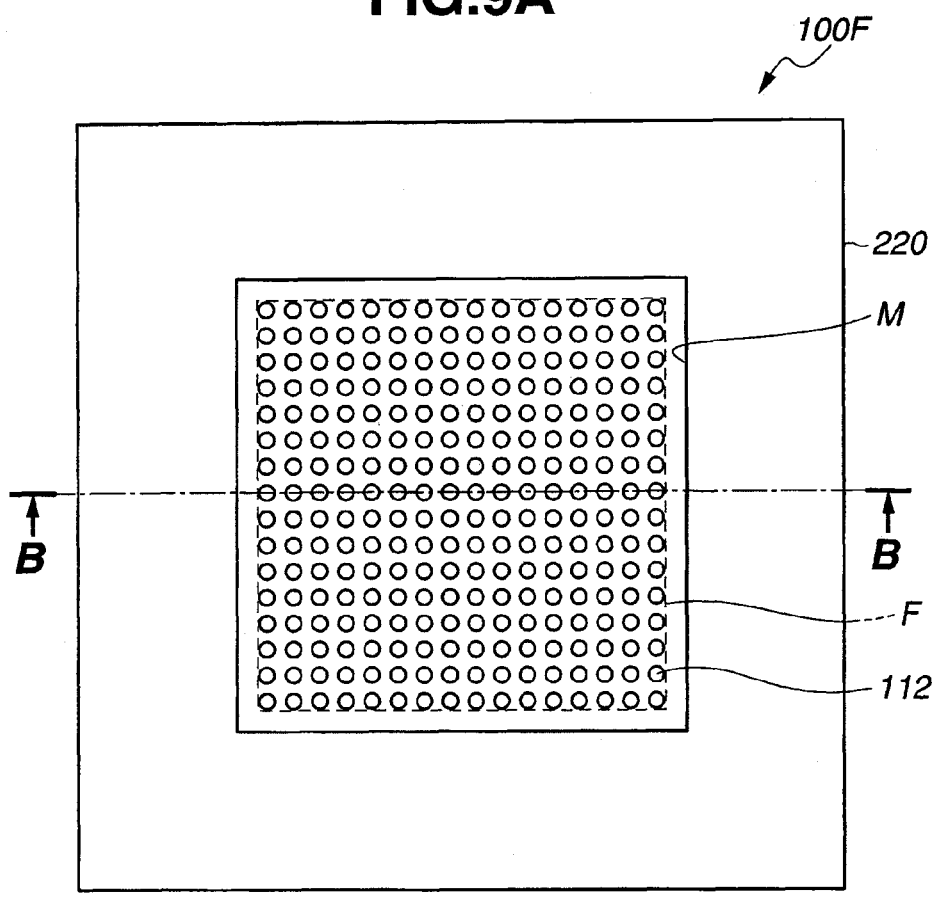
FIG. 9A is a plan view of a wiring board according to a sixth embodiment of the present invention.
Figure 9B:
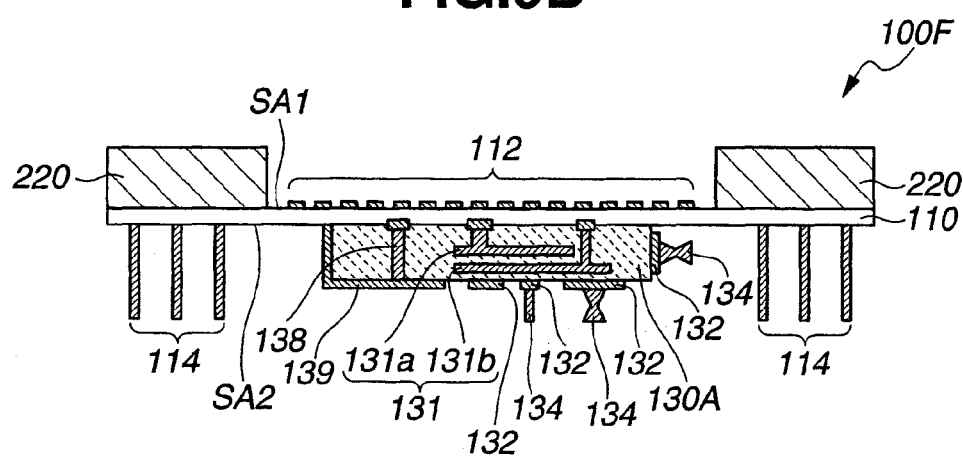
FIG. 9B is a cross-section view of FIG. 9A taken along line B-B.
Figure 10A:
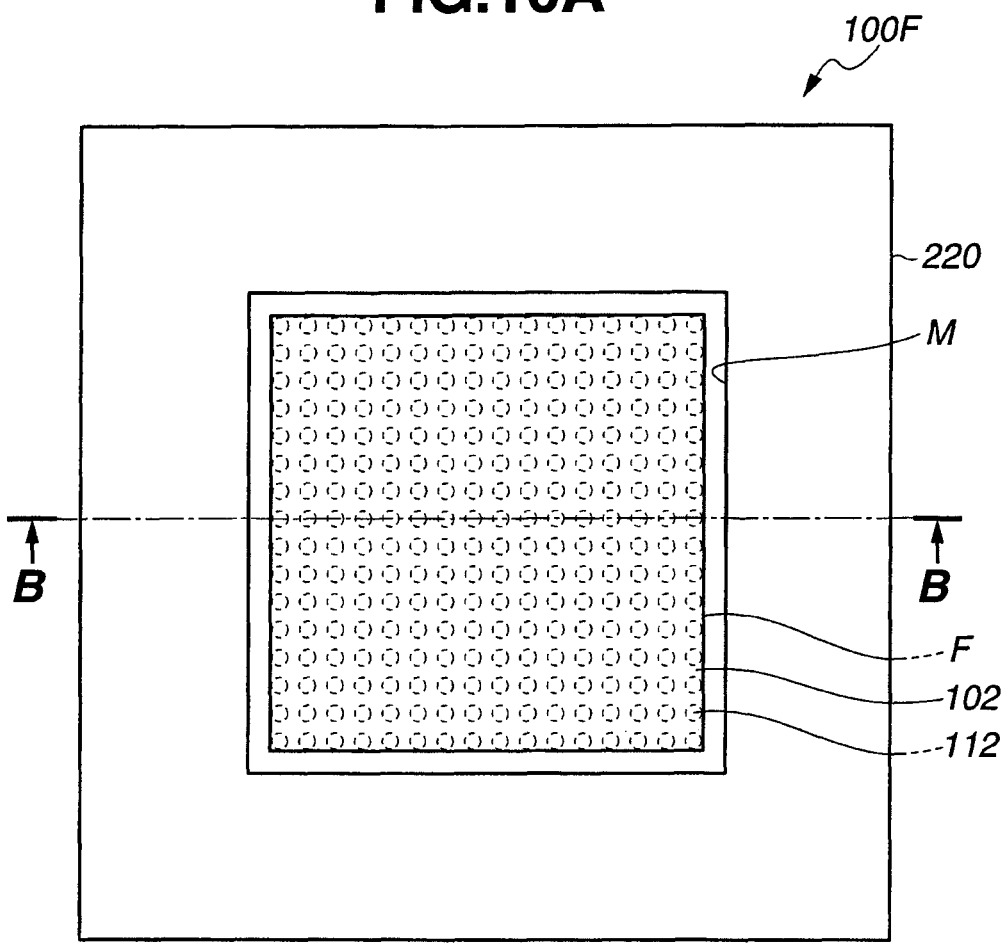
FIG. 10A is a plan view of the wiring board of FIGS. 9A and 9B in a state of mounting thereon a semiconductor chip.
Figure 10B:
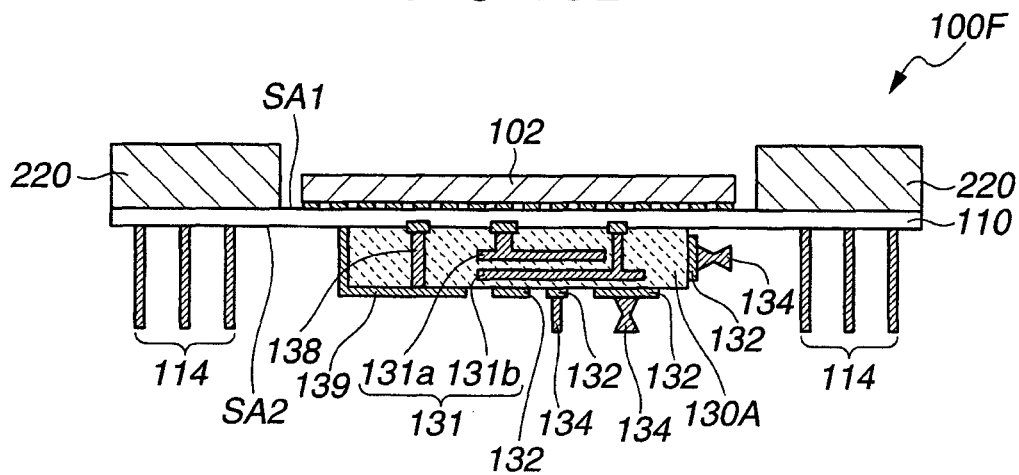
FIG. 10B is a cross-section view of FIG. 10A taken along line B-B.

As shown in FIG. 9B and 10B, the reinforcing plate 130A has its body predominantly formed of ceramic material and incorporating therein a plurality of capacitors 131. In the sixth embodiment, each of the capacitors 131 is designed as a laminated capacitor in which first and second electrode layers 131a and 131b and ceramic layers are alternately laminated together, as in the case of the first embodiment, for ease of incorporation of the capacitors 131 in the reinforcing plate 130A. The reinforcing plate 130A also has cylindrical conductors formed in a thickness direction thereof. The electrode layers 131a and 131b are electrically connected to the multilayer substrate 110 via these cylindrical conductors so that the capacitors 131 functions as so-called decoupling capacitors.

Further, the reinforcing plate 130A has a circuit pattern 132, terminals 134, a via conductor or conductors 138 and a metal layer 139 as shown in FIGS. 9B and 10B. The circuit pattern 132 is formed on a surface of the reinforcing plate 130A and electrically connected to the first terminals 112 via the wiring layers of the multilayer substrate 110 so that an electronic component such as a semiconductor circuit or a sensor element (e.g. a temperature sensor element, a vibration sensor element etc.) can be mounted on the circuit pattern 132 to communicate with the semiconductor chip 102 for improvement of the scalability of the wiring board 100F. The terminals 134 are formed on the circuit pattern 132 so that an external device such as an external circuit, an external power source etc. can be connected to the circuit pattern 132 through the terminals 134 to allow signal transmission from/to the external circuit and power supply from the external power source. These terminals 134 can be in any form such as pins, studs, flanges etc. The via conductor 138 is formed through the reinforcing plate 130A in a thickness direction of the reinforcing plate 130A and electrically independent from the capacitors 131. Each of the via conductors 138 has a through hole and a conductor material filled in the through hole. The metal layer 139 is formed by e.g. metal plating on at least part of the surface of the reinforcing plate 130A. The via conductor 138 and the metal layer 139 are connected to each other so as to readily transfer heat from the semiconductor chip 102 to the metal layer 138 through the via conductors 138 and thereby improve the heat radiation characteristics of the wiring board 100F.

The reinforcing plate 130A with the capacitors 131 can be produced by the same procedure as the stiffener 120A with the capacitors 122. Namely, a paste containing a conductor material e.g. nickel, silver or palladium and dielectric sheets (called "green sheets") containing barium titanate etc. are first prepared. The conductor paste is applied to surfaces of the dielectric sheets by screen printing, thereby forming electrode layers on surfaces of the dielectric sheets. The dielectric sheets with the electrode layers are laminated together and then subjected to firing.

Herein, the cylindrical conductors can be formed by making through holes in the dielectric sheets with the electrode layers by any known technique e.g. laser irradiation or punching, and then, pressing a paste containing nickel etc. as a conductor material into the through holes. The circuit pattern 132 can be formed by preparing a dielectric sheet and screen printing a paste containing silver, nickel, palladium etc. as a conductor material onto a surface of the dielectric sheet.

Figure 11:
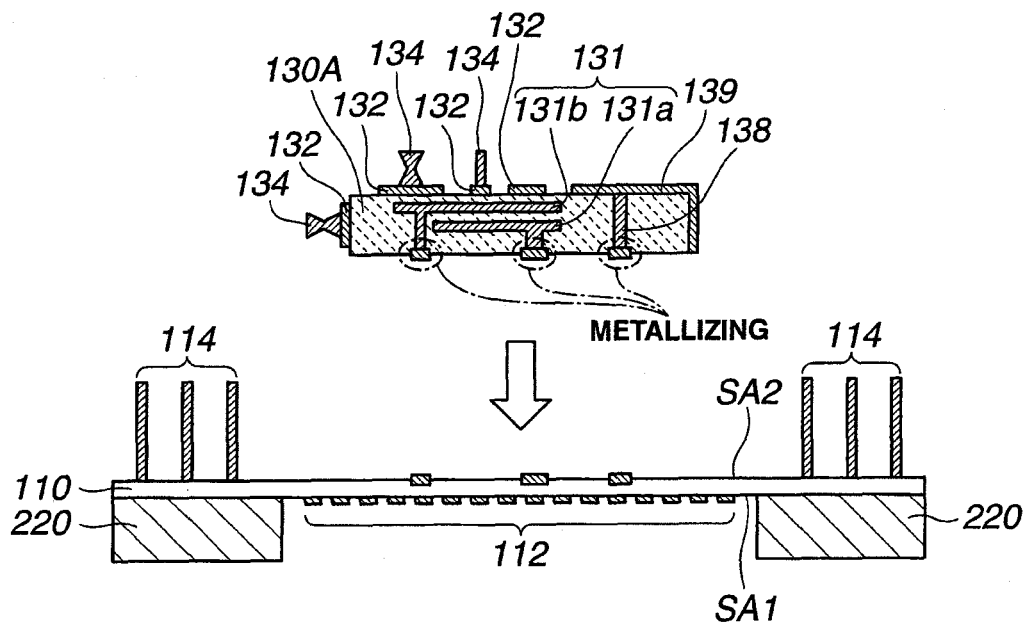
FIG. 11 is a schematic view showing one process for fixing a reinforcing member to a multilayer substrate in the wiring board according to the sixth embodiment of the present invention.
Figure 12:
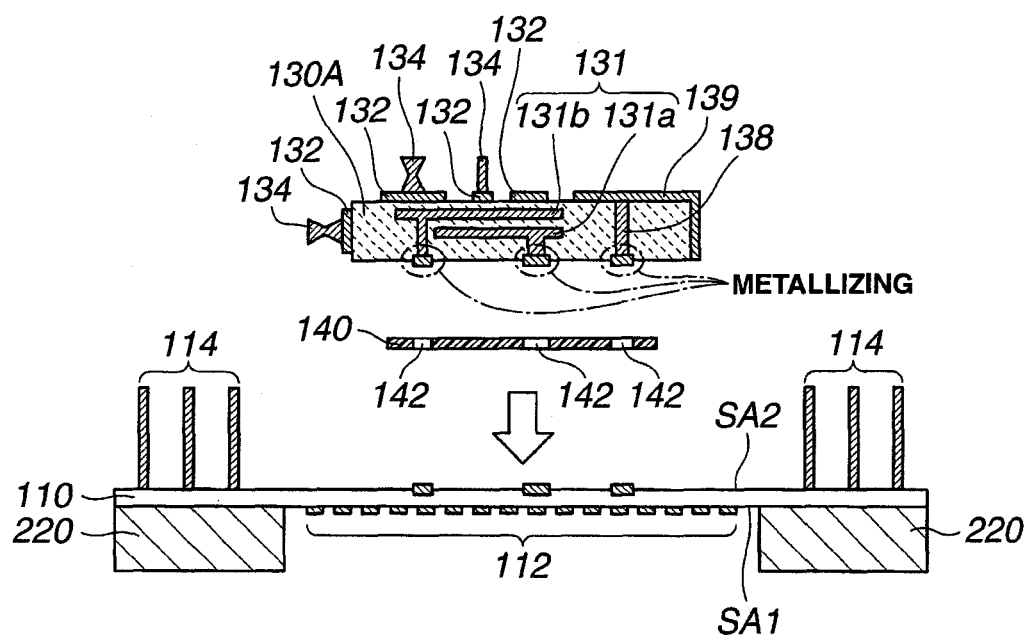
FIG. 12 is a schematic view showing another process for fixing a reinforcing member to a multilayer substrate in the wiring board according to the sixth embodiment of the present invention.
Figure 13A:
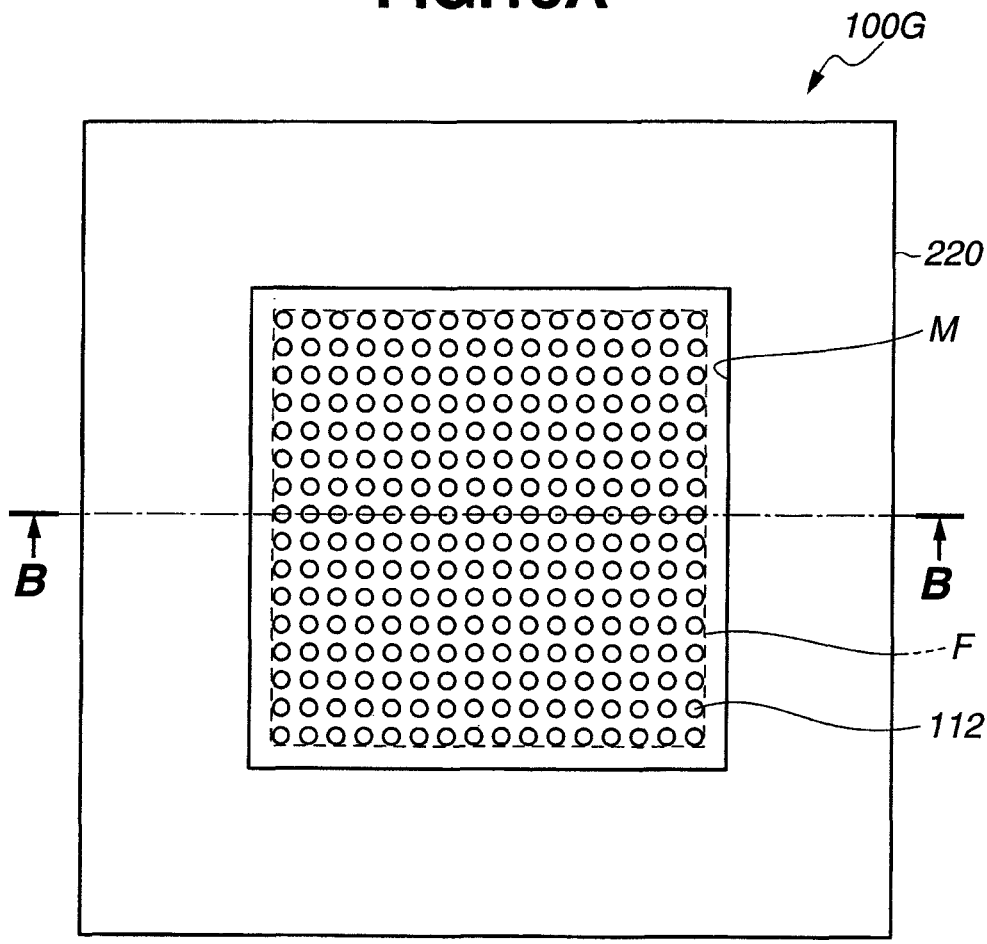
FIG. 13A is a plan view of a wiring board according to a seventh embodiment of the present invention.
Figure 13B:
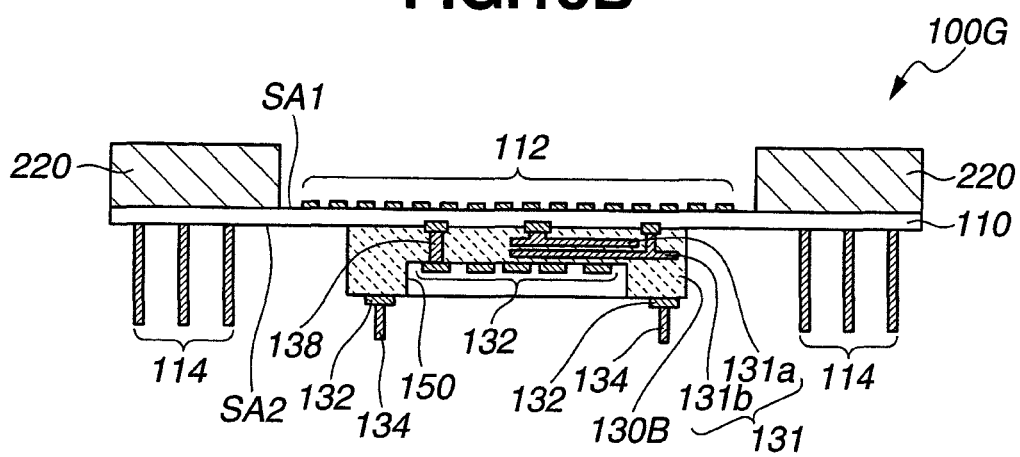
FIG. 13B is a cross-section view of FIG. 13A taken along line B-B.
Figure 14A:
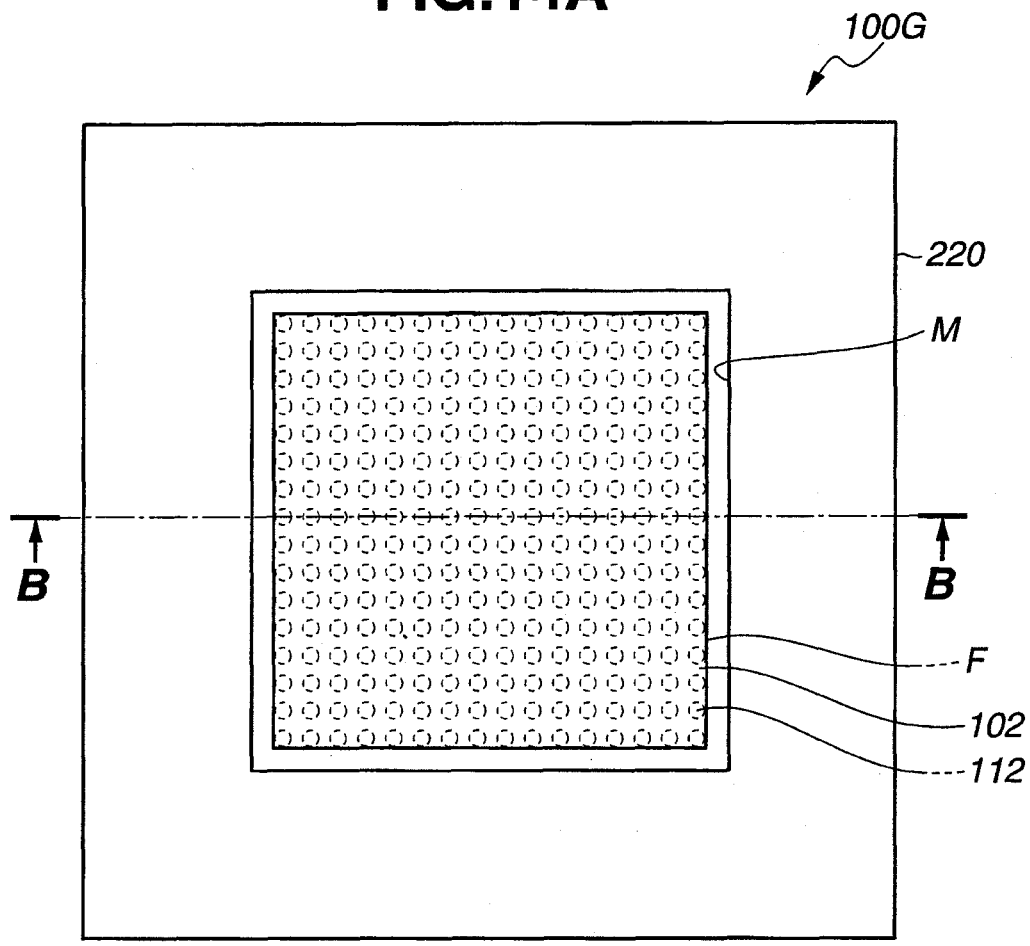
FIG. 14A is a plan view of the wiring board of FIGS. 13A and 13B in the state of mounting thereon an electronic component.
Figure 14B:
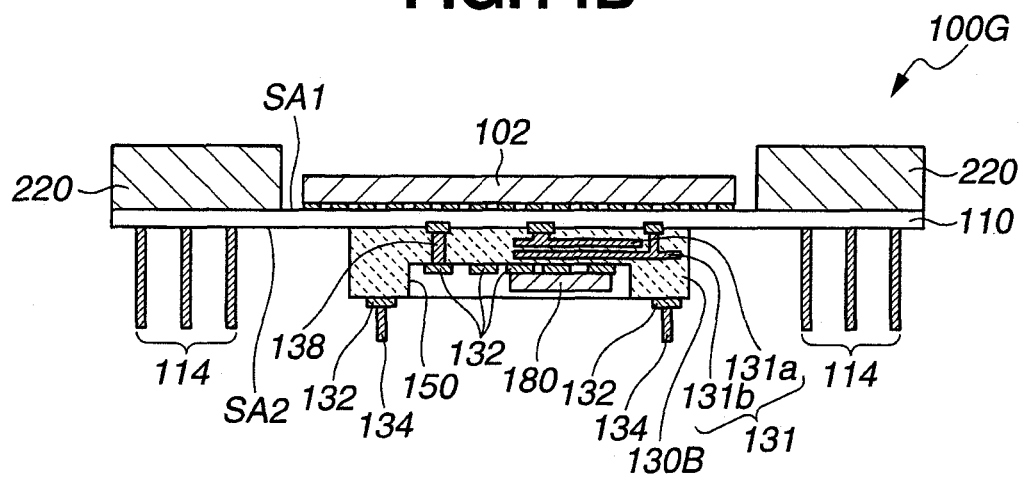
FIG. 14B is a cross-section view of FIG. 14A taken along line B-B.

Further, the reinforcing plate 130A can be fixed to the multilayer substrate 110 by either of the following processes of FIGS. 11 and 12.

In the fixing process of FIG. 11, copper is metallized on terminals of the capacitors 131 and the via conductor 138 of the reinforcing plate 130A by any known thin-film forming technique e.g. PVD. After that, solder printing is applied to component connection terminals on the second main substrate surface SA2 of the multilayer substrate 110. The reinforcing plate 130A is placed on the multilayer substrate 110 to align the copper-metallized terminals of the capacitors 131 and the copper-metallized via conductor 138 with the solder-printed terminals of the multilayer substrate 110. The reinforcing plate 130A is then joined to the multilayer substrate 110 by heat treatment.

In the fixing process of FIG. 12, copper is metallized on terminals of the capacitors 131 and the via conductor 138 of the reinforcing plate 130A by any known thin-film forming technique e.g. PVD. After that, solder printing is applied to component connection terminals on the second main substrate surface SA2 of the multilayer substrate 110. The reinforcing plate 130A is pressed onto the multilayer substrate 110, with resin material 140 interposed therebetween, to align the copper-metallized terminals of the capacitors 131 and the copper-metallized via conductor 138 with the solder-printed terminals of the multilayer substrate 110. The reinforcing plate 130A is then joined to the multilayer substrate 110 by heat treatment. Alternatively, the reinforcing plate 130A may be joined by heat treatment to the multilayer substrate 110 after filling a conductive paste into holes 142 of the resin material 140.

As mentioned above, the capacitors 131 are also incorporated in the reinforcing plate 130A in the sixth embodiment. The adoption of such a reinforcing plate 130A leads to a reduction or elimination of the number of chip capacitors separately arranged on the wiring board 100F (multilayer substrate 110) as well as increase of the strength of the wiring board 100F. It is therefore possible in the sixth embodiment to obtain the same effect as in the first embodiment, i.e., possible to reduce or eliminate the space for chip capacitors in the wiring board 100F and simplify the manufacturing process of the wiring board 100F as compared to the case where a reinforcing member and chip capacitors are separately arranged. It is also possible to secure high capacitance of the capacitors 131 as a plurality of capacitors 131, each having a plurality of electrode layers precisely laminated to each other, can be formed in a wide range of the reinforcing plate 130A. Further, it is possible to mount various kinds of electronic components on the reinforcing plate 130A and improve the scalability of the wiring board 100F as the circuit pattern 132 is formed on the surface of the reinforcing plate 130A.

Seventh Embodiment

A wiring board 100G according to the seventh embodiment is structurally similar to the wiring board 100F according to the sixth embodiment, except that the wiring board 100G has a reinforcing plate 130B (as a reinforcing member) formed with a recess 150 and a temperature sensor element 180 (as an electronic component) arranged to detect a temperature of the wiring board 100G as shown in FIGS. 13A, 13B, 14A and 14B. More specifically, the recess 150 is formed in the surface of the reinforcing plate 130B; and part of the circuit pattern 132 is formed in the recess 150. Further, the temperature sensor element 180 is arranged in the recess 150 and electrically connected to the semiconductor chip 102 via the circuit pattern 132. When the temperature sensor element 180 outputs information about the temperature of the wiring board 100G to the semiconductor chip 102, the semiconductor chip 102 performs various processing operations based on the temperature information from the temperature sensor element 180.

It is therefore possible in the seventh embodiment to obtain the same effects as in the sixth embodiment. It is also possible to improve the ease of mounting of the electronic component on the wiring board 100G as the electronic component is arranged in the recess 150 of the reinforcing plate 130B. Further, it is possible to decrease the distance between the electronic component and the semiconductor chip 102 for reduction of signal transmission loss as compared to the case where an electronic component is located apart from the wiring board 100G.

The entire contents of Japanese Patent Application No. 2010-256784 (filed on Nov. 17, 2010) and No. 2010-256785 (filed on Nov. 17, 2011) are herein incorporated by reference.

Although the present invention has been described with reference to the above specific embodiment of the invention, the present invention is not limited to this exemplary embodiment. Various modification and variation of the embodiment described above will occur to those skilled in the art in light of the above teachings.

For example, there is no particular limitation on the shape of the multilayer substrate 110, 110B, the shape of the stiffener 120A, 120B, 120C, 120D, 120E, 220 and the shape of the reinforcing plate 130A, 130B. Although the multilayer substrate 110, 110B, the stiffener 120A, 120B, 120C, 120D, 120E, 220 and the reinforcing plate 130A, 130B are substantially square-shaped in the first to seventh embodiments, the multilayer substrate 110, 110B, the stiffener 120A, 120B, 120C, 120D, 120E, 220 and the reinforcing plate 130A, 130B can be formed into any other shape such as rectangular shape or circular shape.

Further, BGA (Ball Grid Array) terminals or LGA (Land Grid Array) terminals may alternatively be adopted as the second terminals 114 although PGA terminals are adopted as the second terminals 114 in the first to seventh embodiments.

Although a plurality of capacitors 122 are incorporated in the stiffener 120A, 120B, 120C, 120D, 120E in the first to fifth embodiments, a single capacitor of high capacitance may alternatively be incorporated in the stiffener 120A, 120B, 120C, 120D, 120E. Similarly, a single capacitor of high capacitance may alternatively be incorporated in the reinforcing plate 130A, 130B although a plurality of capacitors 131 are incorporated in the reinforcing plate 130A, 130B in the sixth and seventh embodiments.

Both of the stiffener 120A, 120B, 120C, 120D, 120E and the reinforcing plate 130A, 130B may be provided in the wiring board 100A, 100B, 100C, 100D, 100E, 100F, 100G although either the stiffener 120A, 120B, 120C, 120D, 120E or the reinforcing plate 130A, 130B is provided in the wiring board 100A, 100B, 100C, 100D, 100E, 100F, 100G in the first and seventh embodiments.

There is no particular limitation on the number of electrode layers in the capacitor 122, 131. Although the capacitor 122 is provided with two electrode layers 123 and 124 or three electrode layers 123 to 125 in the first to fifth embodiments, four or more electrode layers may be provided in the capacitor 122. Similarly, three or more electrode layers may be provided in the capacitor 131 although the capacitor 131 is provided with two electrode layers 131a and 131b in the sixth and seventh embodiments.

There is also no particular limitation on the number of semiconductor chips 102 mounted on the wiring board 100A, 100B, 100C, 100D, 100E, 100F, 100G (i.e. the number of chip mounting areas F defined on the multilayer substrate 110, 110B and the number of openings M formed in the stiffener 120A, 120B, 120C, 120D, 120E, 220). The number of semiconductor chips 102 mounted on the wiring board 100A, 100B, 100C, 100D, 100E, 100F, 100G is not limited to one or four and can be set as appropriate to two, three or five or more.

Although the via conductor 138 is connected to the metal layer 139 in the sixth and seventh embodiments, the via conductor 138 may alternatively be connected to the circuit pattern 132 to use the circuit pattern 132 as a radiator plate in place of the metal layer 139.

The circuit pattern 132 may be provided as an independent circuit from the semiconductor chip 102 although the circuit pattern 132 is configured to communicate with the semiconductor chip 102 in the sixth and seventh embodiments.

The electronic chip mounted on the wiring board 100A, 100B, 100C, 100D, 100E, 100F, 100G is not limited to the semiconductor chip 102. The wiring board 100A, 100B, 100C, 100D, 100E, 100F, 100G can be designed to mount thereon any other kind of electronic chip.

The scope of the invention is defined with reference to the following claims.

What is claimed is:

1. A wiring board, comprising;
    a multilayer substrate having a first main substrate surface and a second main substrate surface opposed to the first main substrate surface, the first main substrate surface including a chip mounting area to which an electronic chip is mounted; and
    a reinforcing member comprising a body and a plurality of capacitors incorporated inside the body, the body being predominantly formed of ceramic material and fixed to an area of the first main substrate surface other than the chip mounting area, the reinforcing member defining an opening, the opening exposing the chip mounting area,
    wherein the plurality of capacitors are laminated capacitors comprising first electrode layers, second electrode layers, and ceramic layers alternately laminated together;
    wherein the first electrode layers of the respective capacitors are formed as a plurality of electrically independent electrode patterns in the same layer; and
    wherein the second electrode layers of the respective capacitors are formed as a plurality of electrically independent electrode patterns in the same layer.

\* \* \* \* \*